(12) United States Patent
Iwamoto (10) Patent No.: US 10,468,316 B2
(45) Date of Patent: Nov. 5, 2019

(54) ELECTRONIC COMPONENT MOUNTING BOARD, ELECTRONIC DEVICE, AND ELECTRONIC MODULE

(71) Applicant: KYOCERA Corporation, Kyoto-shi, Kyoto (JP)

(72) Inventor: Hiroki Iwamoto, Satsumasendai (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/988,851

(22) Filed: May 24, 2018

(65) Prior Publication Data

US 2019/0035701 A1    Jan. 31, 2019

(30) Foreign Application Priority Data

Jul. 26, 2017  (JP) .................................. 2017-144591

(51) Int. Cl.
*H01L 23/10* (2006.01)
*H01L 23/13* (2006.01)
*H01L 23/498* (2006.01)
*H01L 23/053* (2006.01)
*H01L 27/146* (2006.01)
(Continued)

(52) U.S. Cl.
CPC ............ *H01L 23/13* (2013.01); *H01L 23/053* (2013.01); *H01L 23/10* (2013.01); *H01L 23/49822* (2013.01); *H01L 23/49838* (2013.01); *H01L 27/14618* (2013.01); *H01L 27/14636* (2013.01); *H01L 33/483* (2013.01); *H01L 21/4853* (2013.01); *H01L 21/4857* (2013.01); *H01L 21/4867* (2013.01); *H01L 23/145* (2013.01); *H01L 23/15* (2013.01);

*H01L 23/49866* (2013.01); *H01L 33/486* (2013.01); *H01L 33/62* (2013.01); *H01L 2224/48091* (2013.01);
(Continued)

(58) Field of Classification Search
CPC ....... H01L 23/13; H01L 23/053; H01L 23/00; H01L 23/10; H01L 23/15; H01L 23/145; H01L 23/498; H01L 23/49822; H01L 23/49838; H01L 23/49866; H01L 27/14618; H01L 27/14636; H01L 33/62; H01L 33/483; H01L 33/486; H01L 2224/48091; H01L 2224/48227; H01L 2224/49175
USPC ....................................................... 257/668
See application file for complete search history.

(56) References Cited

U.S. PATENT DOCUMENTS

2011/0284894 A1* 11/2011 Beom ..................... H01L 33/20
257/98
2014/0176286 A1* 6/2014 Okada ...................... H01B 3/12
336/200
2017/0317014 A1* 11/2017 Tsai ................. H01L 23/49558

FOREIGN PATENT DOCUMENTS

JP    2015-207867 A    11/2015

* cited by examiner

*Primary Examiner* — Chuong A Luu
(74) *Attorney, Agent, or Firm* — Volpe and Koenig, P.C.

(57) ABSTRACT

An electronic component mounting board includes a substrate on which an electronic component is mountable. The substrate includes a plurality of layers stacked on one another, a plurality of conductor layers located between the plurality of layers, and a recess located continuously over side surfaces of the plurality of layers. The electronic component mounting board includes an electrode located in the recess and covering an end of at least one of the plurality of conductor layers in the recess. The conductor layers
(Continued)

contain a metal material different from a metal material contained in the electrode. The conductor layers have outer edges located inward from an outer edge of the substrate in a plan view.

18 Claims, 10 Drawing Sheets

(51) Int. Cl.
    *H01L 33/48*     (2010.01)
    *H01L 21/48*     (2006.01)
    *H01L 33/62*     (2010.01)
    *H01L 23/14*     (2006.01)
    *H01L 23/15*     (2006.01)

(52) U.S. Cl.
    CPC ............... *H01L 2224/48227* (2013.01); *H01L 2224/49175* (2013.01)

ELECTRONIC COMPONENT MOUNTING BOARD, ELECTRONIC DEVICE, AND ELECTRONIC MODULE

BACKGROUND

1. Technical Field

The present invention relates to an electronic component mounting board on which an electronic component, such as an imaging device including a charge-coupled device (CCD) or a complementary metal oxide semiconductor (CMOS) device, a light-emitting device including a light emitting diode (LED), and an integrated circuit, is mounted, and to an electronic device and an electronic module.

2. Description of the Background

An electronic component mounting board including a wiring board formed from insulating layers is known. An electronic device incorporating such an electronic component mounting board and an electronic component mounted on the mounting board is also known (refer to Japanese Unexamined Patent Application Publication No. 2015-207867).

The electronic component mounting board described in Japanese Unexamined Patent Application Publication No. 2015-207867 has recesses on its side surfaces, electrodes covering the surfaces of the recesses, multiple insulating layers, and a conductor layer located between the insulating layers. Electronic component mounting boards have typically become thinner and smaller. A thinner electronic component mounting board includes multiple thinner insulating layers, thus increasing the ratio of the thickness of the conductor layer to the thickness of the multiple insulating layers. A smaller electronic component mounting board has a smaller distance between adjacent electrodes.

BRIEF SUMMARY

An electronic component mounting board according to one aspect of the present invention includes a substrate on which an electronic component is mountable. The substrate includes a plurality of layers stacked on one another, a plurality of conductor layers located between the plurality of layers, and a recess located continuously over side surfaces of the plurality of layers. The electronic component mounting board includes an electrode located in the recess and covering an end of at least one of the plurality of conductor layers in the recess. The conductor layers contain a metal material different from a metal material contained in the electrode. The conductor layers have outer edges located inward from an outer edge of the substrate in a plan view.

An electronic device according to another aspect of the present invention includes an electronic component mounting board, and an electronic component mounted on the electronic component mounting board.

An electronic module according to still another aspect of the present invention includes an electronic device, and a housing located on an upper surface of the electronic device or covering the electronic device.

DETAILED DESCRIPTION

Structures of Electronic Component Mounting Board and Electronic Device

Embodiments will now be described by way of example with reference to the drawings. In the embodiments described below, an electronic device includes an electronic component mounted on an electronic component mounting board. An electronic module includes a housing or a member located on the upper surface of the electronic component mounting board or covering the electronic device. Although the electronic component mounting board, the electronic device, and the electronic module may be arranged to have any of their faces upward or downward, they are herein defined using the orthogonal xyz coordinate system with the positive z direction upward for ease of explanation.

First Embodiment

Figure 1A:
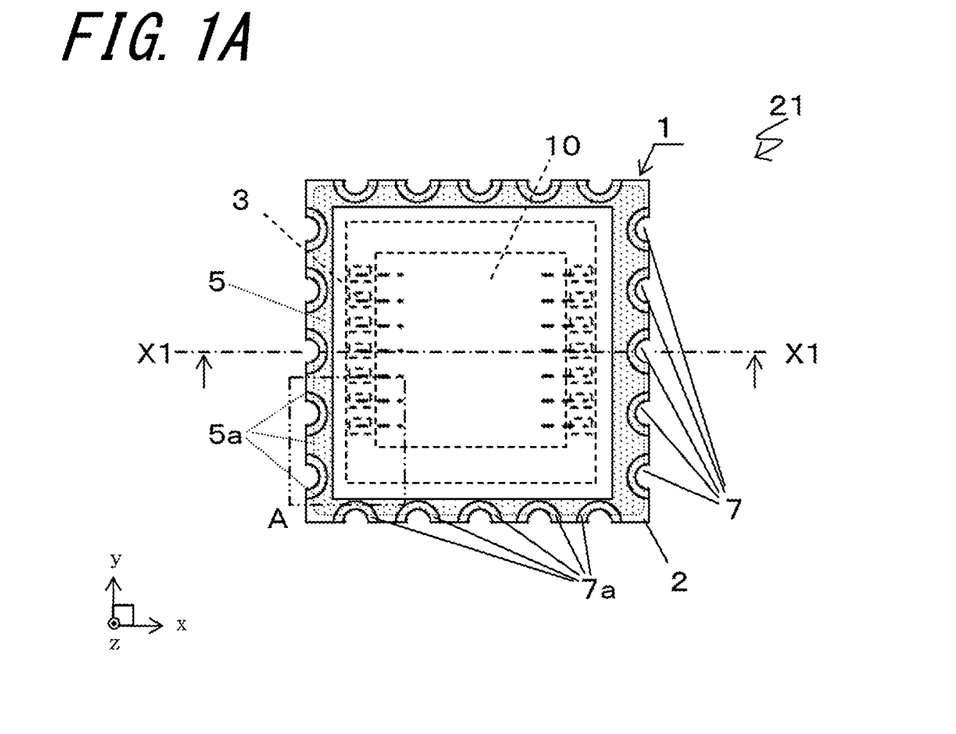
FIG. 1A is an external top view of an electronic component mounting board and an electronic device according to a first embodiment of the present invention.
Figure 1B:
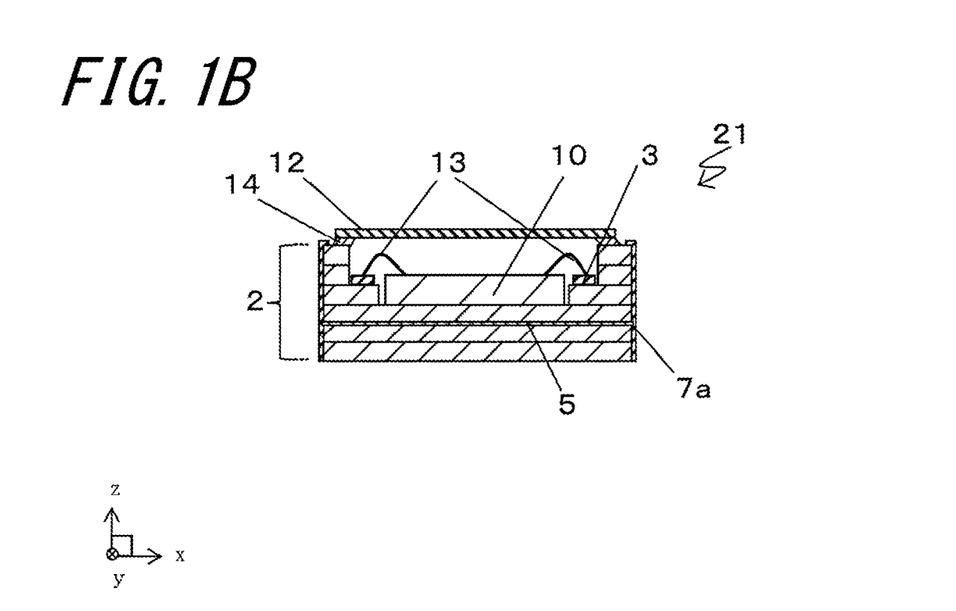
FIG. 1B is a cross-sectional view taken along line X1-X1 in FIG. 1A.
Figure 2A:
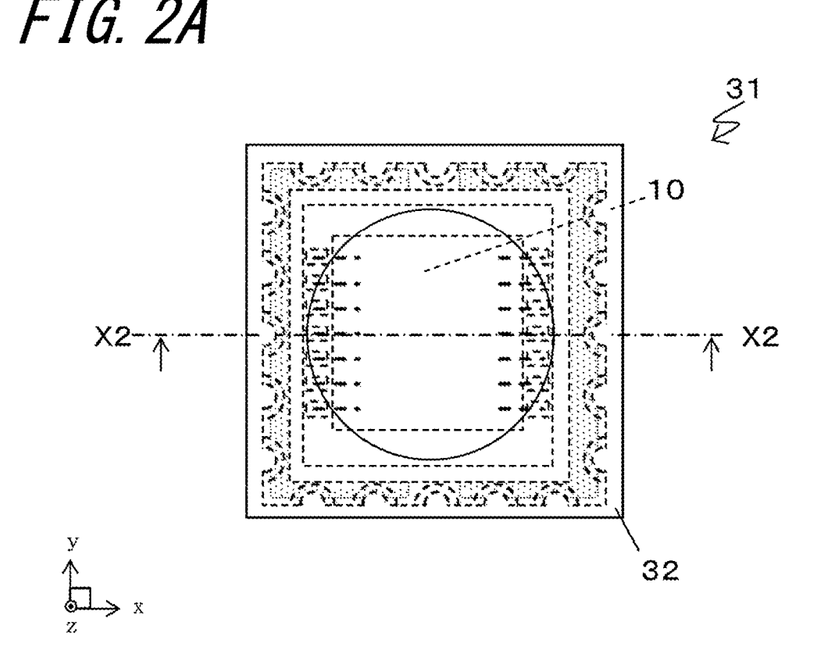
FIG. 2A is an external top view of an electronic module according to the first embodiment of the present invention.
Figure 2B:
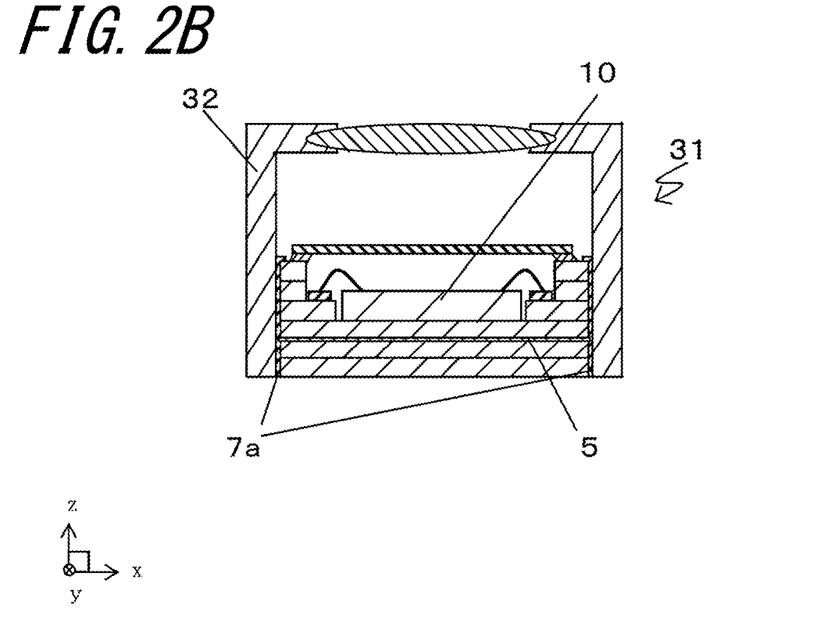
FIG. 2B is a cross-sectional view taken along line X2-X2 in FIG. 2A.

An electronic module 31, an electronic device 21, and an electronic component mounting board 1 according to a first embodiment will be described with reference to FIGS. 1A to 4B. An inner layer in the electronic component mounting board 1 according to the first embodiment of the present invention will be described with reference to FIGS. 3A and 3B. A main part A will be described with reference to FIGS. 4A and 4B. The electronic device 21 according to the present embodiment includes the electronic component mounting board 1 and an electronic component 10. In the present embodiment, FIGS. 1A and 1B show the electronic device 21, FIGS. 2A and 2B show the electronic module 31. FIGS. 3A to 4B show the inner layer included in the electronic component mounting board 1 and its enlarged main part. In FIGS. 1A to 2B, a conductor layer 5 is indicated by dots and dotted lines. In FIGS. 3A to 4B, the conductor layer 5 is indicated by dots and solid lines.

The electronic component mounting board 1 includes a substrate 2, on which the electronic component 10 is mountable. The substrate 2 includes multiple layers stacked on one another. The substrate 2 includes multiple conductor layers 5 located between the multiple layers. The substrate 2 has recesses 7 located continuously over side surfaces of the multiple layers. The recesses 7 of the substrate 2 each receive an electrode 7a located inside to cover an end of at least one of the conductor layers 5 located in the recess 7. The conductor layers 5 and the electrodes 7a contain different metal materials. The conductor layers 5 have outer edges 5a located inward from the outer edge of the substrate 2 in a plan view.

The electronic component mounting board 1 includes the substrate 2, on which the electronic component 10 is mountable. The substrate 2 includes the multiple layers stacked on one another. The insulating layers included in the substrate 2 comprised, for example, electrical insulating ceramic material or a resin such as a thermoplastic resin.

Examples of the electrical insulating ceramic material used for the insulating layers forming the substrate 2 include sintered aluminum oxide, sintered mullite, sintered silicon carbide, sintered aluminum nitride, sintered silicon nitride, and sintered glass ceramic. Examples of the resin used for the insulating layers forming the substrate 2 include a thermoplastic resin, an epoxy resin, a polyimide resin, an acryl resin, a phenolic resin, and a fluorine-based resin. Examples of the fluorine-based resin include a polyester resin and a polytetrafluoroethylene resin.

The substrate 2 may include six insulating layers as shown in FIGS. 1B and 2B, or may include five or less, or seven or more insulating layers. The use of five or less layers reduces the thickness of the electronic component mounting board 1. The use of six or more layers increases the rigidity of the electronic component mounting board 1. As in the examples shown in FIGS. 1A to 2B, the insulating layers may have openings with different sizes. The openings may define a step, on which electrode pads 3 (described later) may be placed.

The electronic component mounting board 1 comprises an outermost perimeter with a length of, for example, 0.3 mm to 100 mm on one side, and may be rectangular or square when it is quadrangular as viewed from above. The electronic component mounting board 1 comprises a thickness of, for example, at least 0.2 mm.

The electronic component mounting board 1 includes the substrate 2, which has the recesses 7 each located continuously over the side surfaces of the multiple layers. As shown in the examples in FIGS. 1A to 4B, the recesses 7 may be substantially semicircular, or rectangular or elliptical as described later, or may be other polygons. The substrate 2, which comprises the recesses 7 located continuously over the side surfaces of the multiple layers, for example, may include a layer with a different size or a layer with no recesses at the upper surface and/or the lower surface. In other words, the recesses 7 may include a layer extending outwardly at the upper surface and/or the lower surface in a cross section.

The multiple layers defining the recesses 7 may include a layer extending outwardly and a layer recessed inwardly in a cross section. In other words, the recesses 7 may include irregular side surfaces (outer edges) in a cross section. This structure may allow a bond such as solder to adhere to the irregular side surfaces to further improve the bond strength.

The side surface of each recess 7 may include an upper portion and/or a lower portion sloping outwardly in a cross section. The upper portion of the side surface of each recess 7 sloping outwardly in a cross section reduces the bond extending over the upper surface portion of each recess 7 when, for example, the recesses 7 and external circuits are connected with the bond formed from solder or a resin. The lower portion of the side surface of each recess 7 sloping outwardly in a cross section allows the bond to remain on the side surface of each recess 7 when, for example, the recesses 7 and external circuits are connected with the bond comprised solder or a resin to further improve the bond strength.

The electronic component mounting board 1 includes the substrate 2 including the multiple conductor layers 5 located between the multiple layers. The recesses 7 of the substrate 2 in the electronic component mounting board 1 each receive an electrode 7a inside to cover an end of at least one of the conductor layers 5. The substrate 2 in the electronic component mounting board 1 may include the electrode pads 3 on its surface.

The substrate 2 may comprise terminal electrodes for connection to external circuits on its upper surface, side surface, or lower surface. The electrodes for connection to external circuits electrically connect the substrate 2 or the electronic device 21 to external circuit boards. The electrodes 7a may electronically connect, for example, the substrate 2 and an external circuit board, the substrate 2 and a housing 32 (described later), or the electronic device 21 and an external circuit board.

In addition to the electrode pads 3, the multiple conductor layers 5, the electrodes 7a, and/or the electrodes for connection to external circuits, the substrate 2 may also include inner wire conductors between the insulating layers, and feedthrough conductors that vertically connect the inner wire conductors on its upper surface or lower surface. The inner wire conductors or feedthrough conductors may be uncovered on the surface of the substrate 2. The inner wire conductors or the feedthrough conductors may electrically connect the electrode pads 3, the multiple conductor layers 5, the electrodes 7a, and/or the electrodes for connection to external circuits.

When the multiple layers comprised an electrical insulating ceramic material, the electrode pads 3, the multiple conductor layers 5, the electrodes 7a, the electrodes for connection to external circuits, the inner wire conductors, and/or the feedthrough conductors are formed from tungsten (W), molybdenum (Mo), manganese (Mn), silver (Ag), or copper (Cu), or an alloy containing one or more of these metals. When the multiple layers comprised a resin, the electrode pads 3, the multiple conductor layers 5, the electrodes 7a, the electrodes for connection to external circuits, the inner wire conductors, and/or the feedthrough conductors comprised copper (Cu), gold, (Au), aluminum (Al), nickel, (Ni), molybdenum (Mo), or titanium (Ti), or an alloy containing one or more of these metals.

The uncovered surfaces of the electrode pads 3, the multiple conductor layers 5, the electrodes 7a, the electrodes for connection to external circuits, the inner wire conductors, and/or the feedthrough conductors may be plated. The plating layer protects the uncovered surfaces of the electrodes for connection to external circuits, the conductor layers, and/or the feedthrough conductors against oxidation. The plating layer also improves the electrical connection between the electrode pads 3 and the electronic component 10 with electronic component connections 13, such as wire bonding. The plating layer may be, for example, a Ni plating layer with a thickness of 0.5 to 10 μm, or this Ni plating layer may further be coated with a gold (Au) plating layer with a thickness of 0.5 to 3 μm.

The electronic component mounting board 1 includes the conductor layers 5 containing different metal materials from those of the electrodes 7a. The electronic component mounting board 1 includes the conductor layers 5 having outer edges 5a inward from the outer edge of the substrate 2 in a plan view. The outer edge of the substrate 2 refers to the outer edge of the substrate 2 excluding the recesses 7. In other words, the outer edge of the substrate 2 refers to the outermost perimeter of the substrate 2, or the portions indicated by the straight lines in FIGS. 1A to 4B.

The electronic component mounting board 1 according to the embodiments includes the conductor layers 5 having outer edges 5a located inward from the outer edge of the substrate 2 in a plan view. This structure can reduce the conductor layers 5 uncovered on the side surface of the substrate 2. This can thus reduce the amount of solder for connecting the electrodes 7a in the recesses 7 of the substrate 2 with other members flowing over the surfaces of the uncovered conductor layers, and thus can reduce short-circuiting between adjacent recesses 7 (electrodes 7a) or between the recesses 7 and other parts.

The electronic component mounting board 1 according to the embodiments includes the conductor layers 5 and the electrodes 7a that contain different metal materials. When the conductor layers 5 comprised a low-resistance material such as copper (Cu) or silver (Ag), the conductor layers 5 covered with the electrodes 7a comprised a material different from copper or silver have less portions exposed to, for example moisture in the air, and thus have less deterioration.

Further, the electrodes 7a containing a metal material different from the metal material for the conductor layers 5 can contain a metal less susceptible to deterioration. This can further protect the conductor layers 5 uncovered on the surface from being exposed to moisture in the air and deteriorating.

The conductor layers 5 in the electronic component mounting board 1 and the electrodes 7a contain different metal materials. For example, when the conductor layers 5 comprised a composite material containing copper (Cu) or silver (Ag), the electrodes 7a may be comprised molybdenum. The conductor layers 5 and the electrodes 7a may contain the same metal material when they each contain at least one different metal material. Also, the conductor layers 5 and the electrodes 7a may not be comprised a composite material. For example, the conductor layers 5 may be comprised a single-element material, which may be copper, and the electrodes 7a may be comprised a single-element material, which may be molybdenum. Either of the conductor layers 5 and the electrodes 7a may be comprised a single-element metal and the other of the conductor layers 5 or the electrodes 7a may be comprised a composite material.

The electronic component mounting board 1 may include the multiple conductor layers 5 comprised a material containing a higher copper content than the material for the electrodes 7a. In other words, the electrodes 7a uncovered on the surface of the electronic component mounting board 1 have a lower copper content than the multiple conductor layers 5. This can reduce migration between the electrodes 7a. This can thus prevent the electrodes 7a from deteriorating due to migration, and prevent such migration from reaching the multiple conductors 5. This structure can thus reduce short-circuiting among the electrodes 7a and/or the multiple conductor layers 5.

In the examples shown in FIGS. 1A to 2B, although the recesses 7 and the electrodes 7a are arranged at equal intervals across the entire perimeter of the substrate 2, the recesses 7 and the electrodes 7a may be arranged simply on one side, or on a part of one side. In particular, when the recesses 7 and the electrodes 7a are arranged on a part of one side, the structure having the features of the embodiments of the present invention produces the same advantages as those described in the embodiments.

Each electrode 7a may entirely or partially cover the side wall of the corresponding recess 7. With each electrode 7a covering the entire side wall of the corresponding recess 7 when, for example, a part of the housing 32 (described later) and/or an external circuit board, and the electrodes 7a are bonded with a bond such as solder, the strength of bonding is further improved and the resistance on the bond surface can be reduced. With each electrode 7a partially covering the side wall of the corresponding recess 7 when, for example, a part of the housing 32 and/or an external circuit board, and the electrodes 7a are bonded with a bond such as solder, the amount and the spread of the bond can be controlled. In this structure, each electrode 7a is sized to cover the multiple conductor layers 5.

Figure 3A:
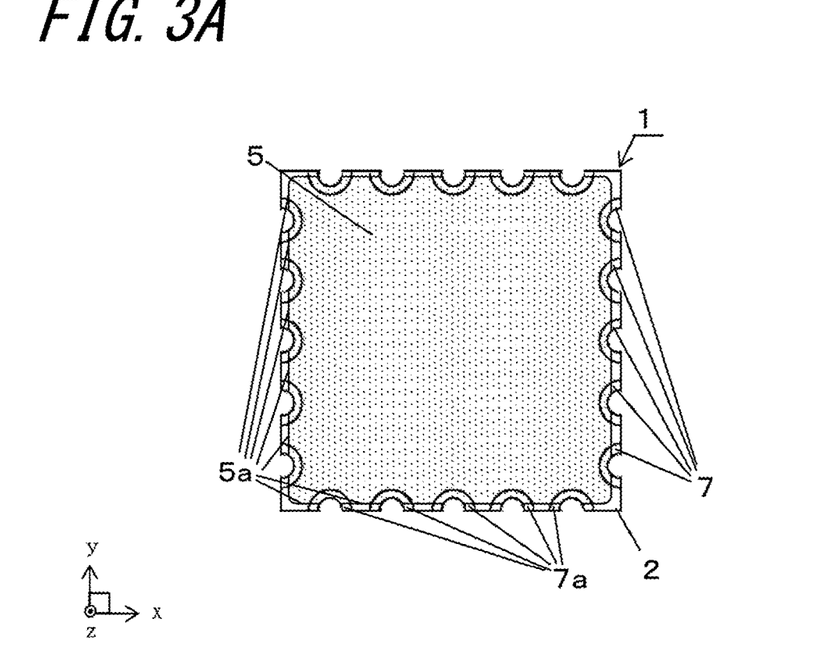
FIG. 3A is a plan view of the electronic component mounting board and the electronic device according to the first embodiment of the present invention showing an inner layer.
Figure 3B:
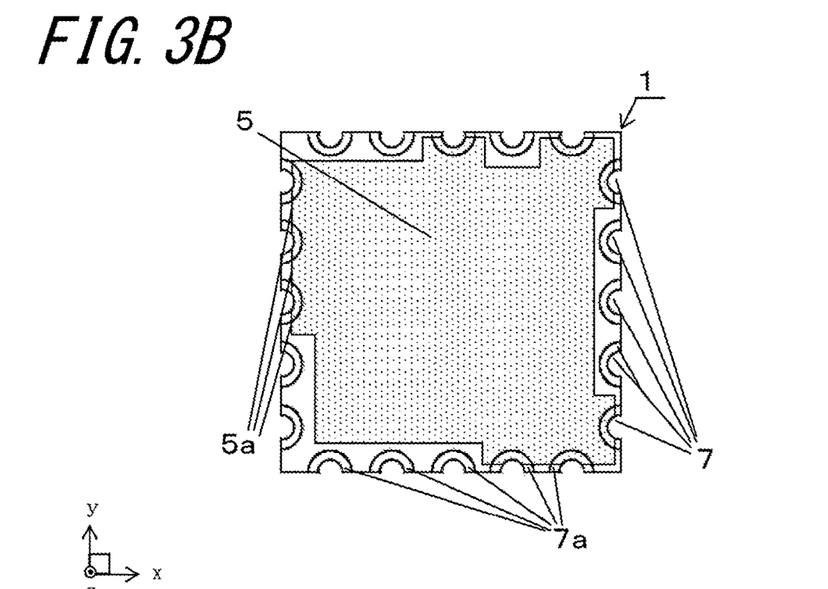
FIG. 3B is a plan view of an electronic component mounting board and an electronic device according to a modification of the first embodiment of the present invention showing an inner layer.
Figure 4A:
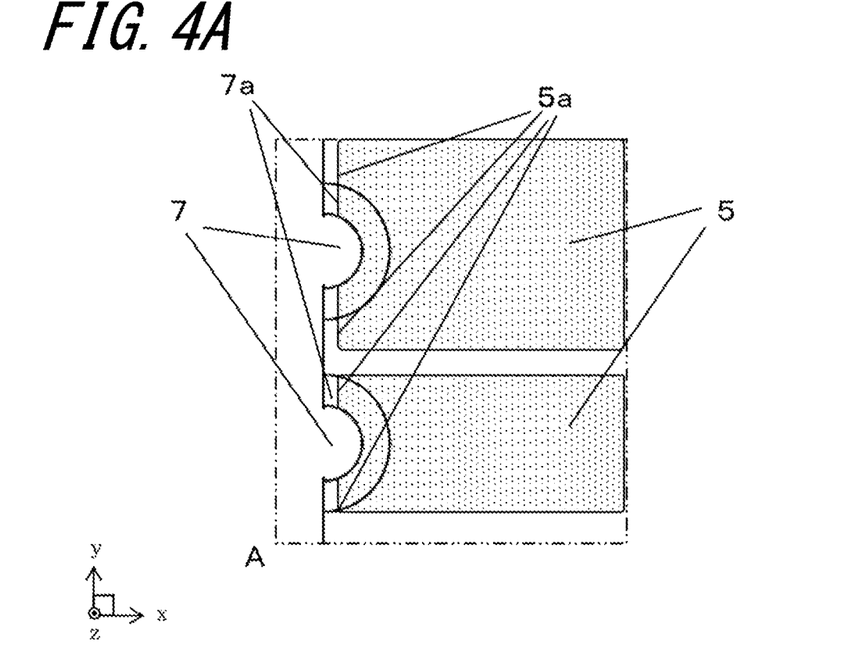
FIGS. 4A and 4B are enlarged plan views of a main part A of the electronic component mounting board according to a modification of the first embodiment of the present invention.
Figure 4B:
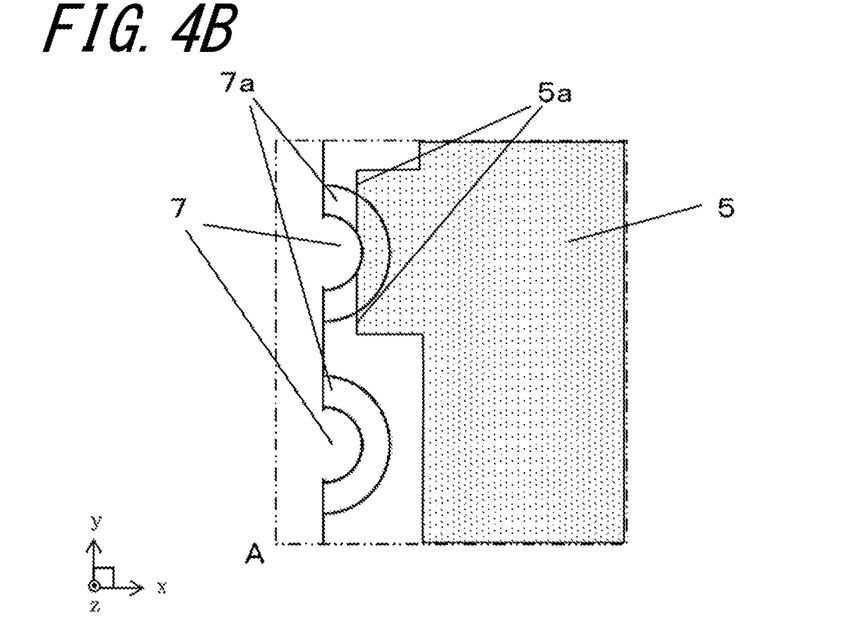

FIG. 3A is a plan view of an electronic component mounting board and an electronic device according to the first embodiment showing an inner layer. FIG. 3B is a plan view of an electronic component mounting board and an electronic device according to a modification of the first embodiment of the present invention showing an inner layer. FIGS. 4A and 4B are enlarged plan views of a main part A according to the embodiment.

The electronic component mounting board 1 may include multiple electrodes 7a that may entirely cover the conductor layers 5 as in the example shown in FIG. 3A, or that may partially cover the conductor layers 5 as in the example shown in FIGS. 3B, 4A and 4B. This depends on the purpose or signals for which the electrodes 7a are to be used.

In the example shown in FIG. 3A, each electrode 7a is connected to all the conductor layers 5. When, for example, the electrodes 7a and the conductor layers 5 are at a ground potential, the electrodes 7a and the conductor layer 5 can have shielding effect. This can reduce external noise affecting, for example, other inner wires arranged on the upper or lower layers of the conductor layers 5. Also, the electrodes 7a arranged on all the sides of the substrate 2 in the example shown in FIG. 3A can cause less noise to be released outside when the electronic device 21 operates.

Electronic Device Structure

FIGS. 1A and 1B show an example of the electronic device 21. The electronic device 21 includes the electronic component mounting board 1 and the electronic component 10 mounted on the upper or lower surface of the electronic component mounting board 1.

The electronic device 21 includes the electronic component mounting board 1 and the electronic component 10 mounted on the electronic component mounting board 1. The electronic component 10 is, for example, an imaging device such as a complementary metal oxide semiconductor (CMOS) device or a charge-coupled device (CCD), a light-emitting device such as a light emitting diode (LED), or an integrated circuit such as a large-scale integrated circuit (LSI). The electronic component 10 may be mounted on the upper surface of the substrate 2 with an adhesive. The adhesive is, for example, silver epoxy or a thermosetting resin.

The electronic device 21 may include a lid 12 that covers the electronic component 10 and is bonded to the upper surface of the electronic component mounting board 1. In this structure, the electronic component mounting board 1 may have the lid 12 connected to the upper surface of a frame portion in the substrate 2, or include a frame that supports the lid 12 and surrounds the electronic component 10 on the upper surface of the substrate 2. The frame may be comprised the same material as or a material different from the material for the substrate 2.

When the frame and the substrate 2 comprised the same material, they may be formed integrally with the uppermost insulating layer, with the frame on the substrate 2 having an opening. In another embodiment, they may be bonded together with, for example, a separately prepared brazing material.

When the substrate 2 and the frame comprised different materials, the frame may be comprised, for example, the same material as the material for a lid bond 14 for bonding the lid 12 to the substrate 2. In this case, the lid bond 14 is thick enough to function both as a bonding member and a frame (as a support for the lid 12). Examples of the lid bond 14 include a thermosetting resin and a brazing material comprised glass with a low melting point or a metal component. The frame and the lid 12 may be comprised the same material. In this case, the frame and the lid 12 may be formed as one piece.

The lid 12 is a highly transparent member formed from, for example, a glass material when the electronic component 10 is an imaging device such as a CMOS and CCD, or a light-emitting device such as an LED. The lid 12 may be formed from a metallic material, a ceramic material, or an organic material when, for example, the electronic component 10 is an integrated circuit.

The lid 12 is bonded to the electronic component mounting board 1 with the lid bond 14. Examples of the material for the lid bond 14 include a thermosetting resin and a brazing material formed from glass with a low melting point or a metal component.

Any thinner and smaller electronic device including the electronic component mounting board 1 as shown in FIGS. 1A and 1B can reduce short-circuiting, and thus can reduce malfunctions.

Electronic Module Structure

FIGS. 2A and 2B show an example of the electronic module 31 including the electronic component mounting board 1. The electronic module 31 includes the electronic device 21 and the housing 32 either located on the upper surface of the electronic device 21 or covering the electronic device 21. In the example described below, the electronic module 31 is, for example, an imaging module.

The electronic module 31 has the housing 32 (lens holder). The housing 32 improves hermetical sealing and prevents the electronic device 21 from directly receiving external stress. The housing 32 comprised, for example, a resin or metal material. The lens holder as the housing 32 may incorporate one or more lenses comprised, for example, a resin, a liquid, glass, or quartz. The housing 32 may include, for example, a drive for vertical or horizontal driving, and may be electrically connected with a bond such as solder to, for example, the electrodes 7a in the electronic component mounting board 1 or other pads.

The housing 32 may include an opening in at least one of the four sides as viewed from above. Through the opening in the housing 32, an external circuit board may be placed for electrical connection to the electronic component mounting board 1. After the external circuit board is electrically connected to the electronic component mounting board 1, the opening in the housing 32 may be sealed with a sealant, such as a resin, to hermetically seal the inside of the electronic module 31.

Any thinner and smaller electronic module 31 including the electronic component mounting board 1 and the electronic device 21 as shown in FIGS. 2A and 2B can reduce short-circuiting, and thus can reduce malfunctions.

Method for Manufacturing Electronic Component Mounting Board and Electronic Device An example method for manufacturing the electronic component mounting board 1 and the electronic device 21 according to the present embodiment will now be described. The manufacturing method described below uses a multi-piece wiring substrate to be cut into the substrates 2.

(1) A ceramic green sheet that is to be the substrate 2 is prepared first. To obtain, for example, the substrate 2 formed from sintered aluminum oxide ($Al_2O_3$), powders, such as silica ($SiO_2$), magnesia ($MgO$), and calcium oxide ($CaO$), are added as a sintering aid to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2 formed from, for example, a resin may be molded using a mold having a predetermined shape by transfer molding or injection molding. The substrate 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2.

(2) A metal paste is then applied or placed, by screen printing or other techniques, into the areas to be the conductor layers 5, the electrode pads 3, the electrodes for connection to external circuits, the inner wire conductors, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the substrate 2. The recesses 7 are formed on each layer with a method described later, and applying or placing a metal paste onto the surface of each recess 7 by, for example, screen printing to form the electrodes 7a.

When the substrate 2 is formed from a resin, the conductor layers 5, the electrode pads 3, the electrodes for connection to external circuits, the inner wire conductors, and the feedthrough conductors can be prepared by, for example, sputtering or vapor deposition. In some embodiments, these components may be prepared by plating after forming a metal film on the surface.

(3) The above green sheet is then processed using, for example, a mold. This process may include forming a recess (through-hole) or a notch in a predetermined portion of the green sheet to be the substrate 2. The recesses 7 may be formed using a mold or by laser processing, and the electrodes 7a may be formed with the method described above.

(4) The ceramic green sheets to be the insulating layers are then stacked and pressed to prepare a ceramic green sheet laminate to be the substrate 2 (or the electronic component mounting board 1). The recesses 7 may be formed in the stacked ceramic green sheets using a mold or by laser processing, and the electrodes 7a may be formed with the method described above.

(5) This ceramic green sheet laminate is then fired at about 1,500 to 1,800° C. to obtain a multi-piece wiring substrate including an array of substrates 2 (electronic component mounting boards 1). In this process, the metal paste described above is fired together with the ceramic green sheet to be the substrate 2 (electronic component mounting board 1) to form the conductor layers 5, the electrode pads 3, the electrodes for connection to external circuits, the inner wire conductors, and the feedthrough conductors.

(6) The multi-piece wiring substrate resulting from the firing process is then cut into multiple substrates 2 (electronic component mounting boards 1). In this cutting process, separation grooves may be formed along the outer edge of each of the substrates 2 (electronic component mounting boards 1), and the multi-piece wiring substrate may be split along the separation grooves into the multiple substrates 2 (electronic component mounting boards 1). In other embodiments, the multi-piece wiring substrate may be cut along the outer edge of each of the substrates 2 (electronic component mounting boards 1) by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer. Before or after the multi-piece wiring substrate is split into multiple substrates 2 (electronic component mounting boards 1), the electrode pads 3, the pads for external connection, and the uncovered wiring conductors may be plated by electro-plating or electroless plating.

(7) The electronic component 10 is then mounted on the upper or lower surface of the electronic component mounting board 1. The electronic component 10 is electrically connected to the electronic component mounting board 1 by electronic component connections 13 such as wire bonding. The electronic component 10 may be fixed onto the electronic component mounting board 1 with an adhesive or another bond applied to the electronic component 10 or to the electronic component mounting board 1. After the electronic component 10 is mounted on the electronic component mounting board 1, the lid 12 may be bonded to the electronic component mounting board 1 with the lid bond 14.

The electronic device 21 is obtained by fabricating the electronic component mounting board 1 and mounting the electronic component 10 on the electronic component mounting board 1 through the processes (1) to (7). The processes (1) to (7) may be performed in any order.

Second Embodiment

Figure 5A:
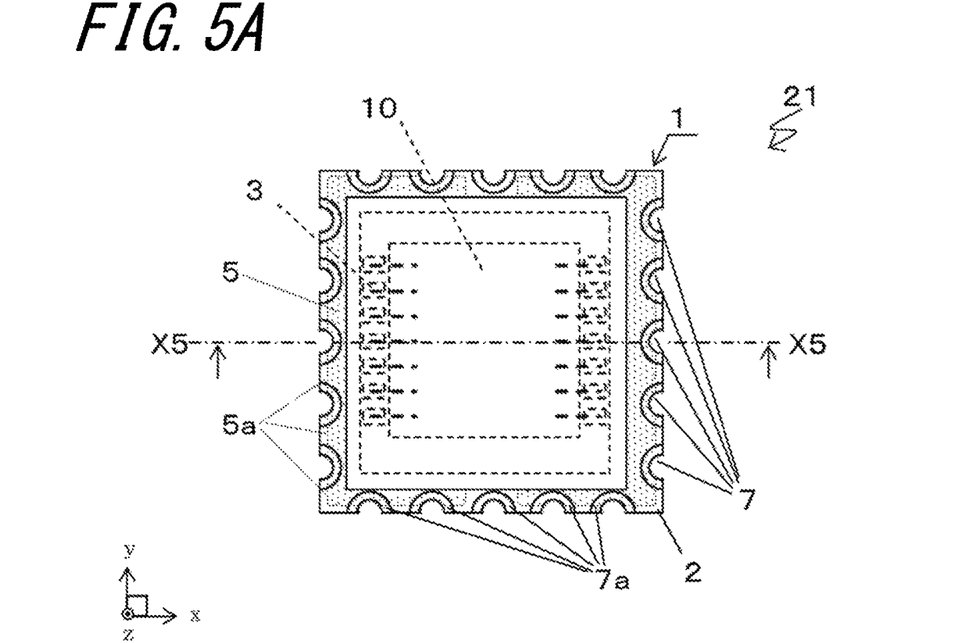
FIG. 5A is an external top view of an electronic component mounting board and an electronic device according to a second embodiment of the present invention.
Figure 5B:
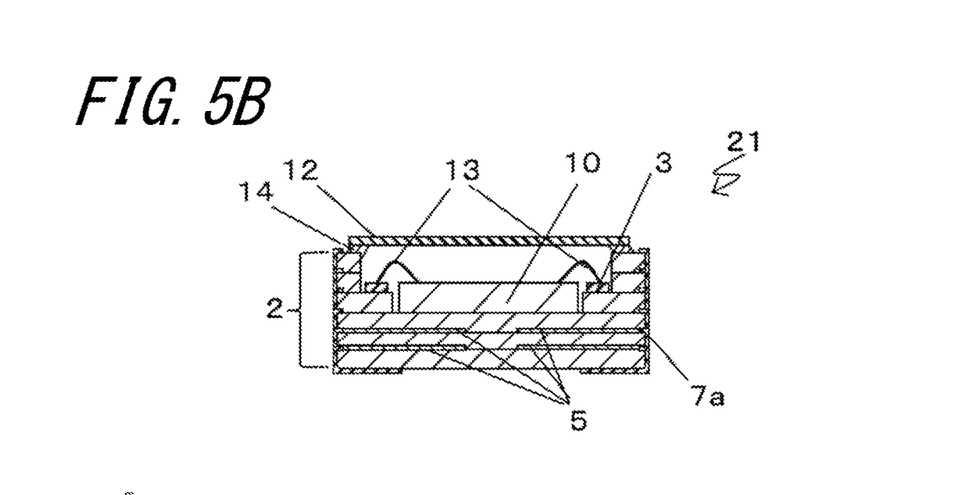
FIG. 5B is a cross-sectional view taken along line X5-X5 in FIG. 5A.
Figure 6:
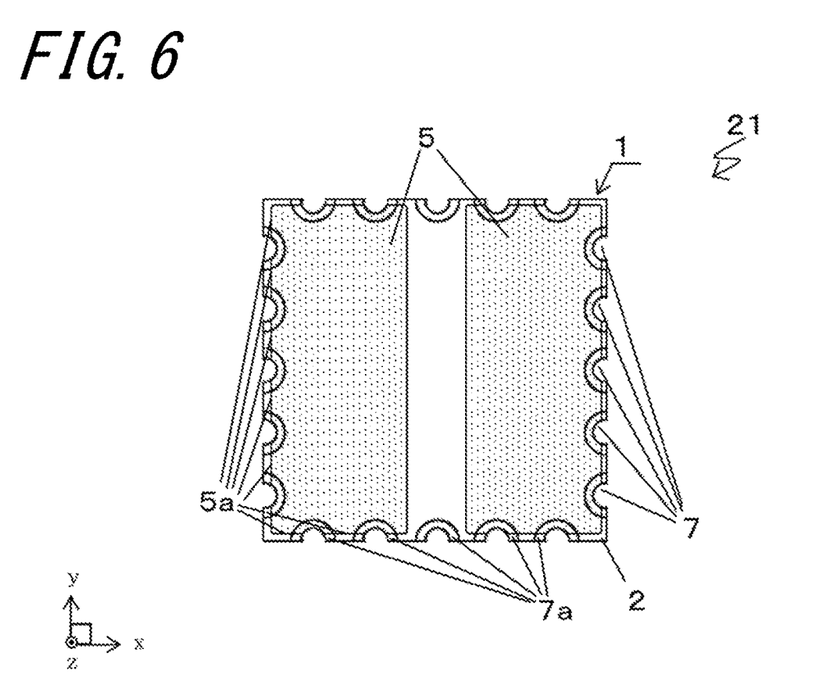
FIG. 6 is a plan view of an electronic component mounting board and an electronic device according to the second embodiment of the present invention showing an inner layer.

An electronic component mounting board 1 according to a second embodiment will now be described with reference to FIGS. 5A to 6. The electronic component mounting board 1 according to the present embodiment differs from the electronic component mounting board 1 according to the first embodiment in that the substrate 2 includes multiple conductor layers 5, and the electrodes 7a includes a shape different from the electrode shape in the first embodiment. In FIGS. 5A and 5B, the conductor layers 5 are indicated by dots and dotted lines. In FIG. 6, the conductor layers 5 are indicated by dots and solid lines.

In the example shown in FIGS. 5A and 5B, the electronic component mounting board 1 includes multiple conductor layers 5 that are electrically insulated from one another. This structure also produces the advantages of the first embodiments.

With the multiple conductor layers 5 having outer edges 5a located inward from the outer edge of the substrate 2 in a plan view, the uncovered portions of the conductor layers 5 may be covered with a different metal material, and the conductor layers 5 may be thus less likely to deteriorate from their ends. As described above, the different metal material may specifically be a metal material with a different copper content, and further the conductor layers 5 may have a higher copper content than the electrodes 7a. This structure can prevent the conductor layers 5 from deteriorating from their ends, from allowing moisture to enter the gaps resulting from the deterioration, and from causing migration between the multiple conductor layers 5.

As shown in the example in FIGS. 5A and 5B, the conductor layers 5 may be located between the multiple layers, and the multiple conductor layers 5 may have the same potential or have different potentials. The multiple conductor layers 5 located between the multiple layers may completely or partially overlap with one another as viewed from above.

As shown in the example in FIGS. 5A and 5B, the electronic component mounting board 1 may have the electrodes 7a located in the recesses 7 and extending continuously from the recesses 7 onto the upper surface of the substrate 2. This structure can reduce resistance between the electronic component 10 and the housing 32 when, for example, the electrodes 7a are directly connected to the electronic component 10 to provide signals controlling the drive of the housing 32 with the electronic component connections 13, such as wire bonding. This allows signals with less deterioration to be transmitted to the housing 32, and reduces a false operation of the housing 32. With the electrodes 7a extending over the upper surface, fillets can form between the electrodes 7a each having a bond such as solder for connecting the electronic component mounting board 1 on its upper surface to the side walls of the housing 32 to improve the bond strength.

As shown in the example in FIGS. 5A and 5B, the electronic component mounting board 1 may include the electrodes 7a located in the recesses 7 and extending continuously from the recesses 7 onto the lower surface of the substrate 2. This structure can allow connection between the electrodes 7a arranged on the lower surface and the electrodes 7a arranged inside the recesses 7 with a bond when, for example, these electrodes 7a may be used for connection to external circuits. The bond thus can form fillets to improve the bond strength.

As shown in the example in FIGS. 5A and 5B, the electronic component mounting board 1 may be included the electrodes 7a located in the recesses 7 and extending continuously from the recesses 7 onto the upper surface or the lower surface of the substrate 2. This structure connects the electronic component 10 to the electrodes 7a arranged on the upper surface with the electronic component connections 13 to minimize the path between the electrodes 7a arranged on the lower surface and the external circuits, thus further lowering the resistance.

As shown in the example in FIGS. 5A to 6, the electronic component mounting board 1 may be included inner wires around the recesses on the layers included in the substrate 2. More specifically, the inner wires surround the recesses 7 as viewed from above. The electrodes 7a and the inner wires arranged around the recesses 7 in a cross section may be electrically connected to each other. This structure can further improve the electrical connection between the upper electrodes 7a and the lower electrodes 7a.

Third Embodiment

Figure 9A:
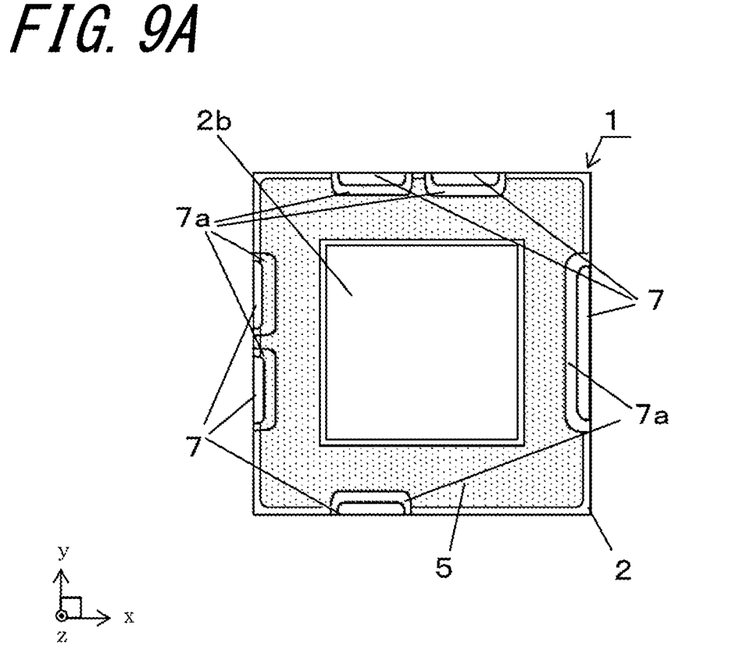
FIG. 9A is a plan view of an electronic component mounting board and an electronic device according to the third embodiment of the present invention showing an inner layer.
Figure 9B:
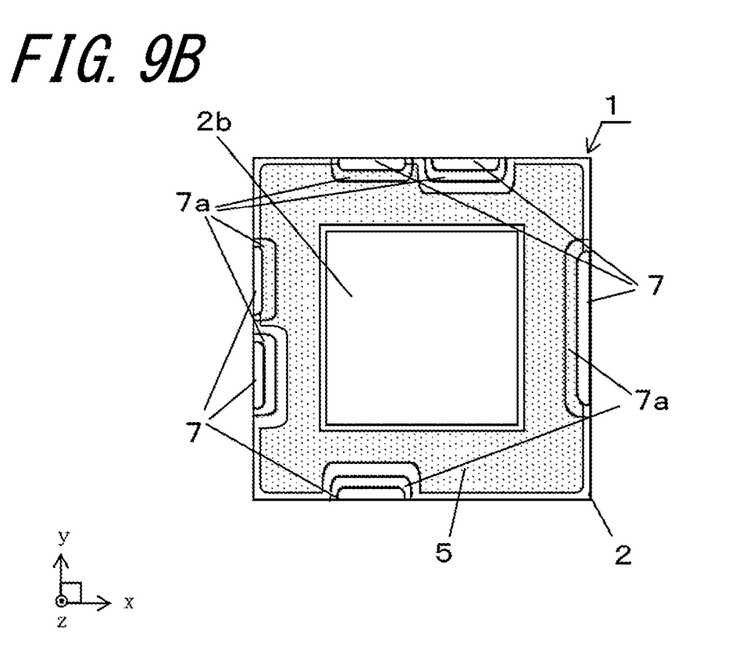
FIG. 9B is a plan view of an electronic component mounting board and an electronic device according a modification of the third embodiment of the present invention showing an inner layer.
Figure 10:
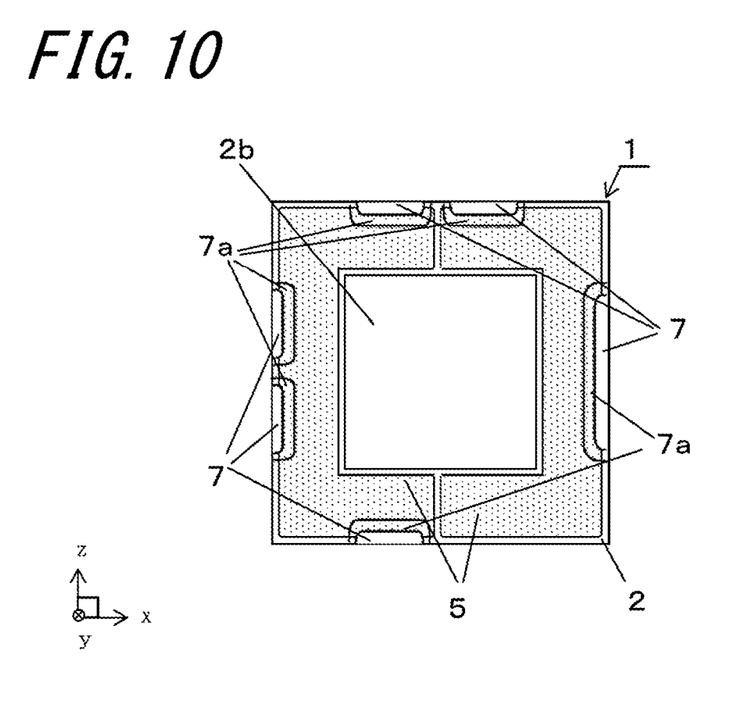
FIG. 10 is a plan view of an electronic component mounting board and an electronic device according to another modification of the third embodiment of the present invention showing an inner layer.

An electronic component mounting board 1 according to a third embodiment will now be described with reference to FIGS. 7A to 10. FIGS. 7A to 8B each show the shapes of an electronic component mounting board 1, an electronic device, and an electronic module according to the present embodiment. FIGS. 9A to 10 each show an inner layer according to the present embodiment. The electronic component mounting board 1 according to the present embodiment differs from the electronic component mounting board 1 according to the first embodiment in that the substrate 2 has a through-hole (the electronic component 10 is mounted with a different method), and the recesses 7 are not continuous from the upper surface to the lower surface of the substrate 2. In FIGS. 7A to 8B, the conductor layers 5 are indicated by dots and broken lines. In FIGS. 9A to 10, the conductor layers 5 are indicated by dots and solid lines.

Figure 7A:
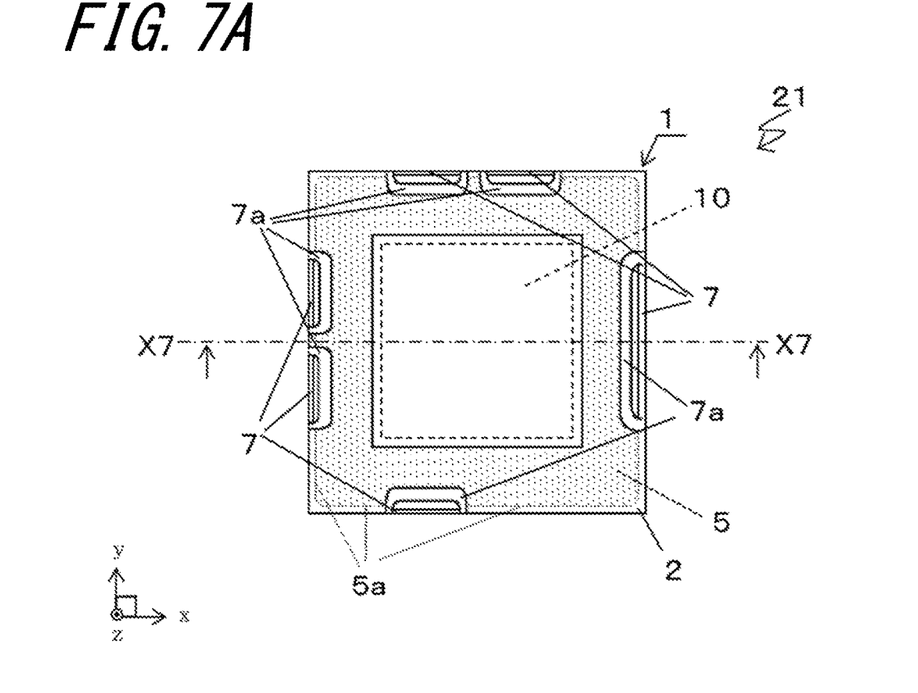
FIG. 7A is an external top view of an electronic component mounting board and an electronic device according to a third embodiment of the present invention.
Figure 7B:
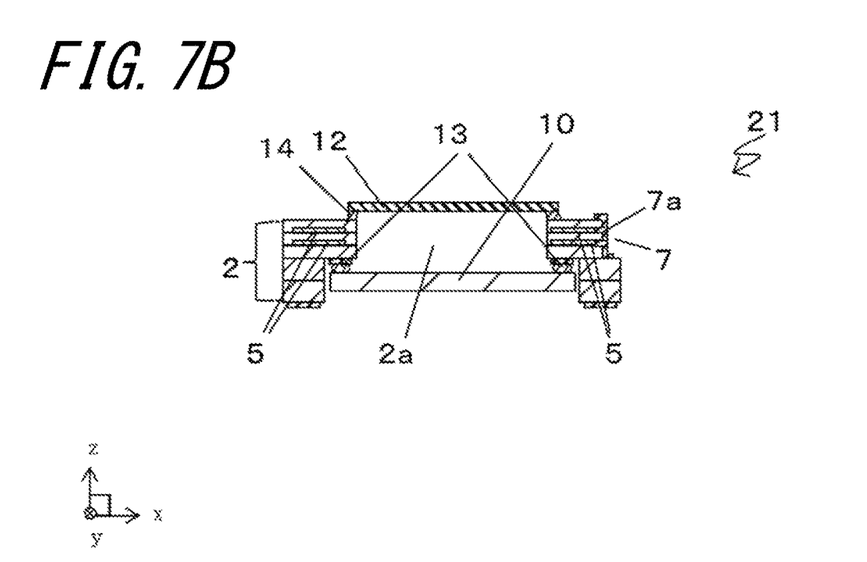
FIG. 7B is a cross-sectional view taken along line X7-X7 in FIG. 7A.

In the example shown in FIGS. 7A and 7B, the electronic component mounting board 1 includes a through-hole 2a in the multiple layers included in the substrate 2 in the direction in which the layers are stacked. The electronic device 21 also includes the electronic component 10 mounted inside the through-hole 2a in the substrate 2 as viewed from above. More specifically, the through-hole 2a may include about the same size as or be slightly smaller than the electronic component 10 as viewed from above. This structure also allows the electronic component mounting board 1, which has the conductor layers 5 with the outer edges 5a inward from the outer edge of the substrate 2 in a plan view, to reduce parts of the conductor layers 5 uncovered on the side surfaces of the substrate 2. This structure thus prevents the solder for bonding the electrodes 7a in the recesses 7 of the substrate 2 with other members from flowing over the uncovered conductor layers 5, and thus reduces short-circuiting between adjacent recesses 7 (electrodes 7a) or between electrodes 7a and other parts.

The structure shown in the example in FIGS. 7A and 7B allows the electronic component 10 to be mounted under the substrate 2 at a sufficiently long distance from the lens when, for example, the electronic component 10 is an imaging device. This reduces the height of the electronic module 31 further. The electronic component mounting board 1 allows electronic parts to be mounted on its surface. The structure shown in FIGS. 7A and 7B allows more electronic parts to be mountable, and thus can further reduce the size of the electronic device. The through-hole 2a may be located around the center of the substrate 2 or may deviate from the center of the substrate 2.

The electronic parts include, for example, passive components including chip capacitors, inductors, and resistors, and active components including optical image stabilizers (OISs), signal processors, and gyro sensors. The electronic parts may be connected to the pads on the substrate 2 with a bond, such as solder or a conductive resin. The electronic parts may be connected to the electronic component 10 with conductors such as the conductor layers 5, the inner wire conductors, and the feedthrough conductors in the substrate 2.

The electronic component 10 in FIGS. 7A and 7B may be first bonded to the electronic component mounting board 1 with an electronic component connection 13, such as gold bumps and solder balls, and then may be sealed with a sealant to strengthen the bonding. The electronic component 10 may also be bonded with an electronic component connection 13 including an anisotropic conductive film (ACF).

In the example shown in FIGS. 7A and 7B, the recesses 7 are substantially rectangular as viewed from above. This structure also produces the advantages of the present application. Such recesses 7 may be used to receive the feet of the housing 32. In this case, the feet of the housing 32 may be larger to improve stability. The recesses 7, which are substantially rectangular as viewed from above, may be wider while extending less toward the center of the substrate 2 than when the recesses are substantially circular.

Figure 8A:
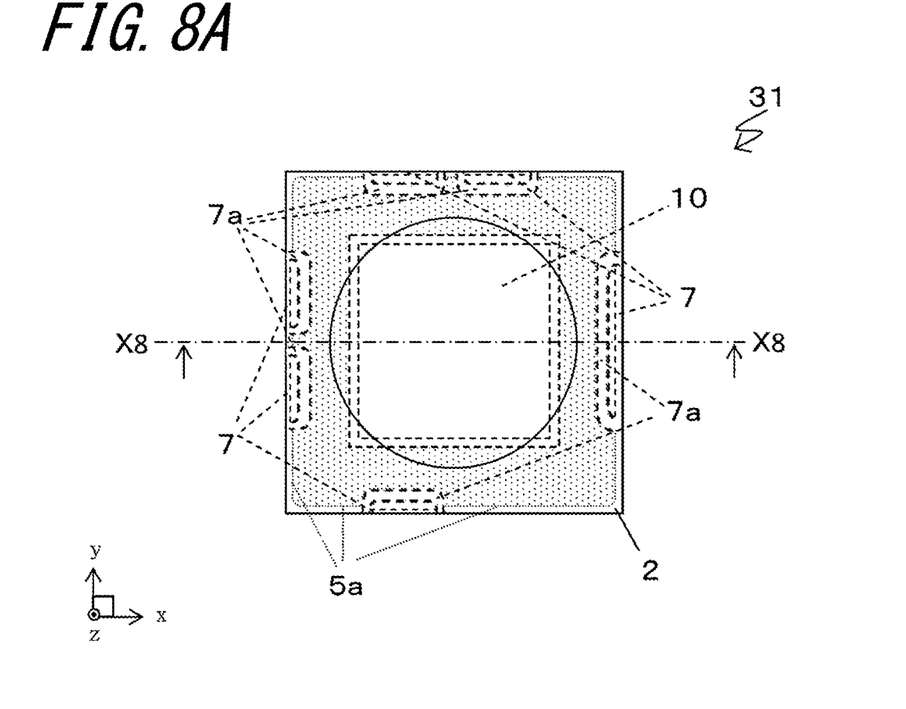
FIG. 8A is an external top view of an electronic module according to the third embodiment of the present invention.
Figure 8B:
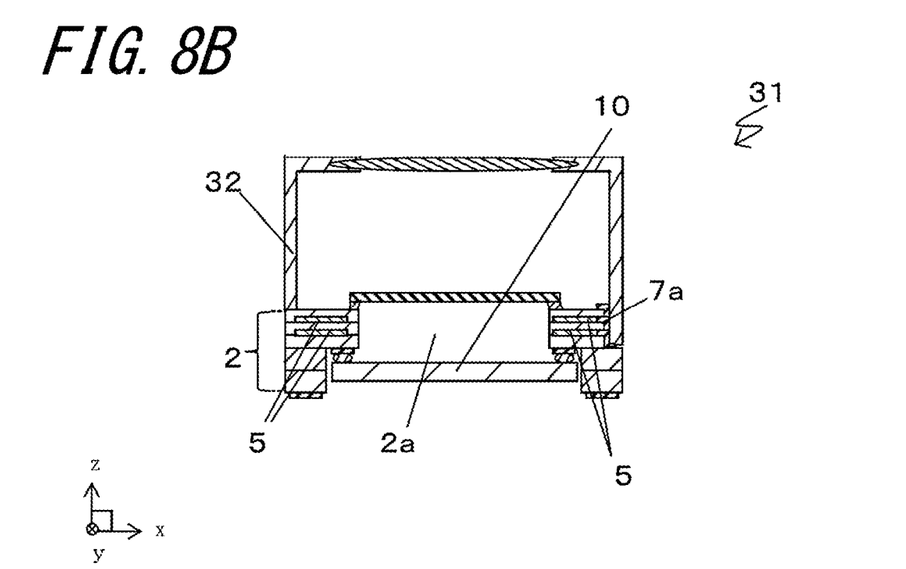
FIG. 8B is a cross-sectional view taken along line X8-X8 in FIG. 8A.

FIGS. 8A and 8B show the electronic module 31 according to the present embodiment. As in the example shown in FIG. 8B, the lens housing 32, which is arranged on the upper surface of the substrate 2, may partially be received in the recesses 7 (and the electrodes 7a). In this structure, the conductor layers 5 having the outer edges 5a inward from the outer edge of the substrate 2 in a plan view as in the present application prevent a bond such as solder for connecting the housing 32 from flowing out of the recesses 7 and onto the uncovered conductor layers 5. This structure reduces short-circuiting between adjacent recesses 7 (electrodes 7a) or between the recesses and other parts. This can also prevent the bond such as solder from flowing out of the recesses 7 onto the uncovered conductor layers 5 and unexpectedly widening the outer edge of the substrate 2, and from causing the structure to be unfit with the housing 32 or from coming in contact with other parts and causing short-circuiting.

In the example shown in FIGS. 8A and 8B, each recess 7 having a protruding lower layer receives an electrode 7a that extends outwardly. This structure allows the housing 32 to be connected at its ends as well, thus improving the strength and reliability of bonding.

FIG. 9A is a plan view of the electronic component mounting board and the electronic device according to a third embodiment each showing an inner layer. FIGS. 9B and 10 are plan views of an electronic component mounting board and an electronic device according to modifications of the third embodiment each showing an inner layer.

The electronic component mounting board 1 may include multiple electrodes 7a that may entirely cover the conductor layers 5 as in the example shown in FIG. 9A as in the first embodiment, or that may partially cover the conductor layers 5 as in the example shown in FIG. 9B. This depends on the purpose or signals for which the electrodes 7a are to be used. When the electrodes 7a are in contact with some of the conductor layers 5 as in the example shown in FIG. 9B, the other conductor layers 5 having different signals in the upper or lower layers may be connected to the other electrodes 7a. In this structure, the electrodes 7a may be used to provide signals for driving when, for example, the housing 32 of the electronic module 31 is drivable with signals.

The structure shown in FIG. 10 includes two conductor layers 5 that are electrically independent of each other. As in the second embodiment, this structure can also reduce deterioration of the conductor layers 5 from their ends. This structure can prevent the conductor layers 5 from deteriorating from their ends, from allowing moisture to enter the gaps resulting from the deterioration, and from causing migration between the multiple conductor layers 5.

A method for manufacturing the electronic component mounting board 1 shown in FIGS. 7A to 10 includes, in addition to the processes described in the first embodiment, forming a through-hole 2a at an intended position using a mold or a laser beam through the ceramic green sheet to be the substrate 2. The process is followed by the same processes as described in the first embodiment to complete the electronic component mounting board 1 shown in FIGS. 7A to 10.

The present invention is not limited to the examples described in the above embodiments. All the features including numerical values may be modified variously. For example, although the electrode pads 3 are quadrangular as viewed from above in the examples shown in FIG. 1A to FIG. 10, they may be circular or may be other polygons. Also, for example, the recesses 7 in the examples shown in FIGS. 1A to 10 are semicircular or substantially rectangular, the recesses may be elliptical or polygonal, or may be in shapes combining these.

In the embodiments, any number of electrodes 3 with any shapes may be in any arrangement, and the electronic component may be mounted with any method. Various combinations of the features of the embodiments are not limited to the above examples in the embodiments. The embodiments of the present invention may be combined in any manner unless any contradiction arises.

REFERENCE SIGNS LIST 1 electronic component mounting board
2 substrate
2a through-hole
3 electrode pad
5 conductor layer
5a outer edge of conductor layer
7 recess
7a electrode
10 electronic component
12 lid
13 electronic component connection
14 lid bond
31 electronic module
32 housing

What is claimed is:

1. An electronic component mounting board, comprising:
   a substrate on which an electronic component is mountable, the substrate including:
      a plurality of stacked layers formed by stacking a plurality of conductor layers and insulator layers on one another in a stacking direction, wherein each of the plurality of conductor layers have an outer edge that is located inward from an outer edge of the substrate in a plan view, and
      a recess formed through the plurality of stacked layers along a side surface of the plurality of stacked layers; and
   an electrode located in the recess that extends along the stacking direction, wherein the electrode is electrically coupled to at least one of the plurality of conductor layers in the recess,
   wherein each of the plurality of the conductor layers contain a metal material different from a metal material contained in the electrode.

2. The electronic component mounting board according to claim 1, wherein
   the plurality of conductor layers comprise a material having a higher copper content than a material for the electrode.

3. The electronic component mounting board according to claim 1, wherein
   the electrode extends continuously from the recess onto an upper surface of the substrate.

4. The electronic component mounting board according to claim 2, wherein
   the electrode extends continuously from the recess onto an upper surface of the substrate.

5. The electronic component mounting board according to claim 1, wherein
   the electrode extends continuously from the recess onto a lower surface of the substrate.

6. The electronic component mounting board according to claim 2, wherein
   the electrode extends continuously from the recess onto a lower surface of the substrate.

7. The electronic component mounting board according to claim 3, wherein
   the electrode extends continuously from the recess onto a lower surface of the substrate.

8. The electronic component mounting board according to claim 4, wherein
   the electrode extends continuously from the recess onto a lower surface of the substrate.

9. The electronic component mounting board according to claim 1, wherein
   the substrate has a through-hole extending in the direction in which the plurality of layers are stacked.

10. The electronic component mounting board according to claim 2, wherein
    the substrate has a through-hole extending in the direction in which the plurality of layers are stacked.

11. The electronic component mounting board according to claim 3, wherein
    the substrate has a through-hole extending in the direction in which the plurality of layers are stacked.

12. The electronic component mounting board according to claim 4, wherein
    the substrate has a through-hole extending in the direction in which the plurality of layers are stacked.

13. The electronic component mounting board according to claim 5, wherein
    the substrate has a through-hole extending in the direction in which the plurality of layers are stacked.

14. The electronic component mounting board according to claim 6, wherein
    the substrate has a through-hole extending in the direction in which the plurality of layers are stacked.

15. The electronic component mounting board according to claim 7, wherein
    the substrate has a through-hole extending in the direction in which the plurality of layers are stacked.

16. The electronic component mounting board according to claim 8, wherein
    the substrate has a through-hole extending in the direction in which the plurality of layers are stacked.

17. An electronic device, comprising:
    an electronic component;
    a substrate on which the electronic component is mounted, the substrate including:
       a plurality of stacked layers formed by stacking a plurality of conductor layers and insulator layers on one another in a stacking direction, wherein each of the plurality of conductor layers have an outer edge that is located inward from an outer edge of the substrate in a plan view, and
       a recess formed through the plurality of stacked layers along a side surface of the plurality of alternating layers; and an electrode located in the recess that extends along the stacking direction, wherein the electrode is electrically coupled to at least one of the plurality of conductor layers in the recess, wherein each of the plurality of the conductor layers contain a metal material different from a metal material contained in the electrode.

18. An electronic module, comprising:

the electronic device according to claim 17; and a housing located on an upper surface of the electronic device or covering the electronic device.

* * * * *